United States Patent
Dodge

(10) Patent No.: US 10,673,396 B1
(45) Date of Patent: Jun. 2, 2020

(54) SERIES-CONNECTED FETS IN ACTIVE LINEAR MODE

(71) Applicant: United Silicon Carbide, Inc., Monmouth Junction, NJ (US)

(72) Inventor: Jonathan Dodge, Lebanon, OR (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 16/263,291

(22) Filed: Jan. 31, 2019

(51) Int. Cl.
*H03F 1/22* (2006.01)
*H03F 3/193* (2006.01)
*H03K 17/687* (2006.01)
*H03F 3/21* (2006.01)

(52) U.S. Cl.
CPC .......... *H03F 3/1935* (2013.01); *H03F 3/211* (2013.01); *H03K 17/6872* (2013.01)

(58) Field of Classification Search
CPC ........................................................ H03F 1/22
USPC ........................................ 330/311, 296, 285
See application file for complete search history.

(56) References Cited

U.S. PATENT DOCUMENTS 4,484,226 A * 11/1984 Parker ...................... H04N 9/72
348/379

2003/0016086 A1* 1/2003 Yang ........................ H03F 1/223
330/311
2014/0097828 A1* 4/2014 Bertin ................ G01R 19/0092
324/132

OTHER PUBLICATIONS

Dodge, "UnitedSiC JFET in Active Mode Applications", United Silicon Carbide Application Note AN0016, UnitedSiC, Apr. 2018, 9 pages.
Frey et al., "New 500 V Linear MOSFETs for a 120 kW Active Load", PCIM Europe, Jun. 7, 2000, 8 pages.

* cited by examiner

*Primary Examiner* — Henry Choe
(74) *Attorney, Agent, or Firm* — BakerHostetler

(57) ABSTRACT

The addition of gate bias resistors substantially balances the voltage across any number of series-connected FETs, while the feedback control of the gate-source voltage of one FET controls the current through all of the FETs. In this way, the thermal load and voltage stress are substantially balanced for series connected FETs operating in active linear mode (partially on), enabling operation at voltages much higher than the individual ratings of low cost, readily available FETs. Alternatively, series-connecting FETs for active-mode operation is thermally equivalent to paralleling because the FET heat load is practically uniform, enabling operation at much higher current. This concept is extended to a series connection of FETs that can block, pass, and/or limit alternating load current with the voltage applied across all the FETs being either polarity or alternating polarity. We provide analysis, practical design considerations, and simulation results.

20 Claims, 9 Drawing Sheets

US 10,673,396 B1

SERIES-CONNECTED FETS IN ACTIVE LINEAR MODE

BACKGROUND

This disclosure pertains to high power semiconductor switching devices and circuits.

SUMMARY

A power circuit includes number of semiconductor switch devices, such as field-effect transistors (FETs) that are connected in series and operated in an active linear mode via network of gate bias impedances, such as resistors, that balance voltage across the switch devices. A feedback control for the gate-to-source voltage of one of the switch devices controls the current through all of the switch devices.

When operating in an active linear mode (partially on), the total thermal load and voltage stress may be substantially balanced across the switch devices. This enables the power circuit to operate at voltages much higher than the voltage rating of the individual switch devices. Similarly, series-connecting FETs for active-mode operation is thermally equivalent to connecting the devices in parallel, because the FET heat load is practically uniform, which enables operation at a much higher current, as compared with using a single switch device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying drawings.

FIG. 6A shows simulation results for voltage shared across load FETs and the slight variations due to threshold voltages.

FIG. 6B shows simulation results for current through a current sensor.

FIG. 6C shows simulation results for voltage across a cutoff switch SW1.

FIG. 6D shows simulation results for FET gate-source voltages kept within a safe range.

DETAILED DESCRIPTION

A power circuit comprising a number of semiconductor switch devices that are connected in series may be controlled by a network of gate bias impedances, such as resistors, that balance voltage across the switch devices, wherein a feedback control of the gate-to-source voltage of one switch device controls the current through all of the switch devices by way of the bias network. The semiconductor switch devices may be field-effect transistors (FETs) such as JFETs and MOSFETS, for example. This allows the switch devices to share the overall voltage load of the power circuit, and therefore to share the power and thermal loads of operation.

One or more low-voltage switches may be added to the power circuit to block current through all the series-connected semiconductor switches. This is useful for fast turn-off during a fault condition, for example, and for simply maintaining the current at practically zero.

The power circuit may include multiple sets of series-connected semiconductor switches, e.g., to enable bi-polar voltage sharing, current control, and shutoff applications. For example, a power circuit with a single set of series-connected semiconductor switches may be used to implement a DC electronic load control or solid-state circuit breaker (SSCB). A power circuit with two or more sets of series-connected semiconductor switches may be used to implement, for example, an AC current limiter or SSCB.

Figure 1:
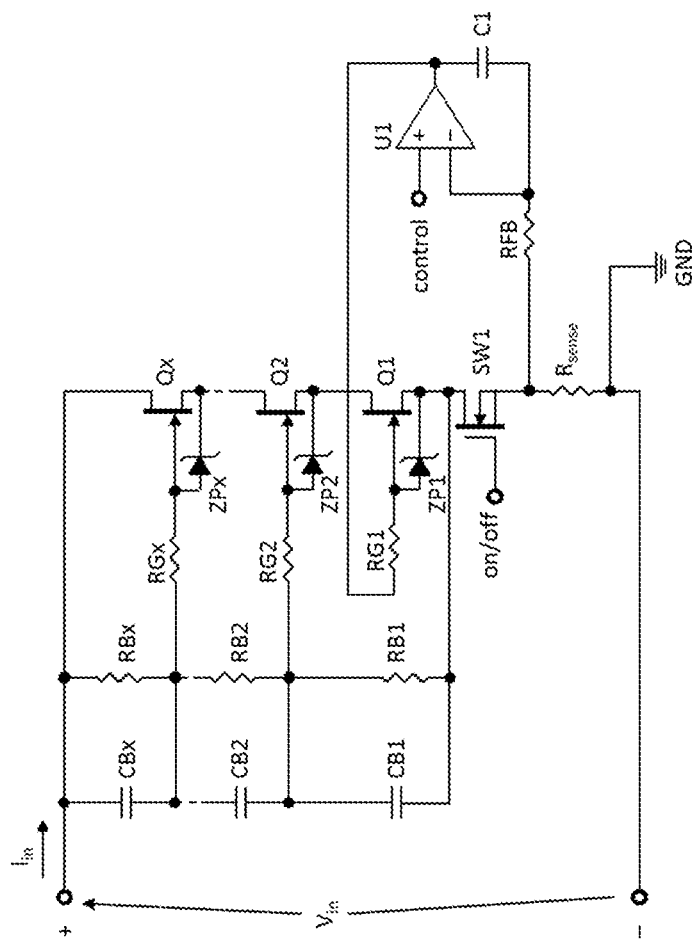
FIG. 1 is a schematic of an example circuit using multiple FET switch devices that may be operated in active linear mode with gate bias resistors controlling the voltage balance across each FET, and one FET controlling the current through all the FETs, as may be used for voltage sharing, current control, and shutoff for DC applications, for example.
Figure 2:
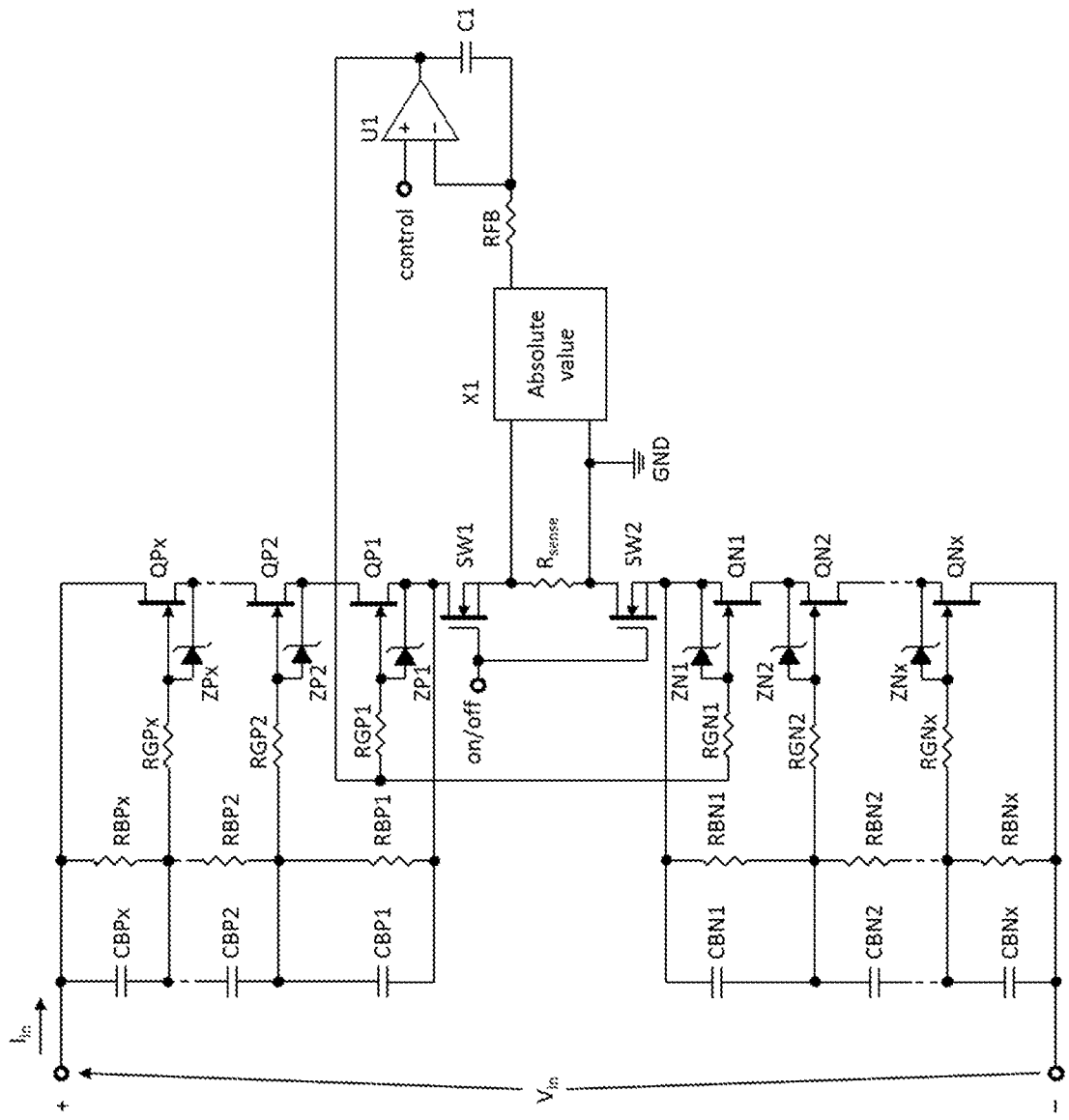
FIG. 2 is a schematic of an example similar to the schematic of FIG. 1, but where a second set of series-connected FETs, bias resistors, bias capacitors, and shutoff FETs are connected in a way that allows operation with positive and negative input voltages, with corresponding control over positive and negative current. The circuit of FIG. 2 may be used for voltage sharing, current control, and shutoff for AC applications, for example.

FIG. 1 illustrates the use of series-connected FETs with voltage sharing, current control, and shutoff that may be used, for example, for DC applications. FIG. 2 illustrates the use of two sets of series-connected FETs with voltage sharing, current control, and shutoff, for example, for AC applications.

Traditionally, expensive semiconductor devices have been used to address high voltage requirements in active linear mode of operation. For example, linear MOSFETs may be used. Linear MOSFETS are high voltage MOSFETs that are specially processed for partially-on operation. See, e.g., R. Frey, D. Grafham, T. Mackewicz; "New 500 V Linear MOSFETs for a 120 kW Active Load", PCIM Europe, June 2000.

Linear MOSFETs are very costly, and have high on-resistances, which degrades the maximum current and minimum on-voltage specifications of electronic equipment. Furthermore, even though the Forward-bias Safe Operating Area (FSOA) of linear MOSFETs is superior to that of conventional MOSFETs, linear MOSFETs suffer thermal instability at high voltage and low current, significantly limiting the FSOA. See, e.g., J. Dodge, "UnitedSiC JFET in Active Mode Applications", United Silicon Carbide application note AN0016, April 2018.

FIGS. 1 and 2 illustrate an alternative to the use of linear MOSFETS in which lower-cost, commercially available power semiconductor switches are connected in series to meet a high operating voltage requirement. Solutions of the kind illustrated in the examples of FIGS. 1 and 2 additionally increase the thermal load capability of each semiconductor switch for two reasons. First, the operating current can be increased proportional to the reduced voltage across each semiconductor switch. Second, the current can be further increased for some semiconductor switches because the limiting portion of the FSOA is avoided, namely at high voltage and low current. By paralleling such circuitry, operation at even higher currents can be achieved.

Any non-latching semiconductor switch may be used to implement the power circuits described herein. This includes, for example, a voltage-controlled semiconductor switch, such as a Metal Oxide Semiconductor Field Effect Transistor (MOSFET), Junction Field Effect Transistor (JFET), Metal Semiconductor Field Effect Transistor (MESFET), Insulated Gate Bipolar Transistor (IGBT), among others. The semiconductor switch used may be constructed from any state-of-the-art material, including but not limited to silicon, silicon-carbide, and gallium-nitride.

The power circuits described herein may also be implemented using Bipolar Junction Transistors (BJTs.) However, for high power/high voltage power circuits, BJTs may exhibit undesirable thermal instability, and further may require substantial base current.

Further, the power circuits described herein may be implemented using P-channel semiconductor switches, e.g., by switching the polarities of the n-channel device examples illustrated herein. However, in many applications, an N-channel SiC JFET may be preferred as the semiconductor switch due to, e.g., excellent thermal stability and low on-resistance even for devices with high voltage ratings.

In the examples herein, the term Field Effect Transistor (FET) may be used interchangeably with the term semiconductor switch, mindful that an engineer of ordinary skill in the art will appreciate that various forms of FETs, IGBTs, BJTs, and the like may be substituted with minor adjustments to design. The disclosure will therefore be understood to pertain to power semiconductor switch types and materials that are known for implementing such switches.

The power circuits described herein to implement electronic loads, SSCBs, current limiters, and similar applications use power semiconductor switches in what herein is often referred to as an "active linear mode" to control the voltage across a load and/or current through a load. "Active linear mode" refers to the semiconductor switches being partially on, rather than simply "on" or "off."

Figure 3:
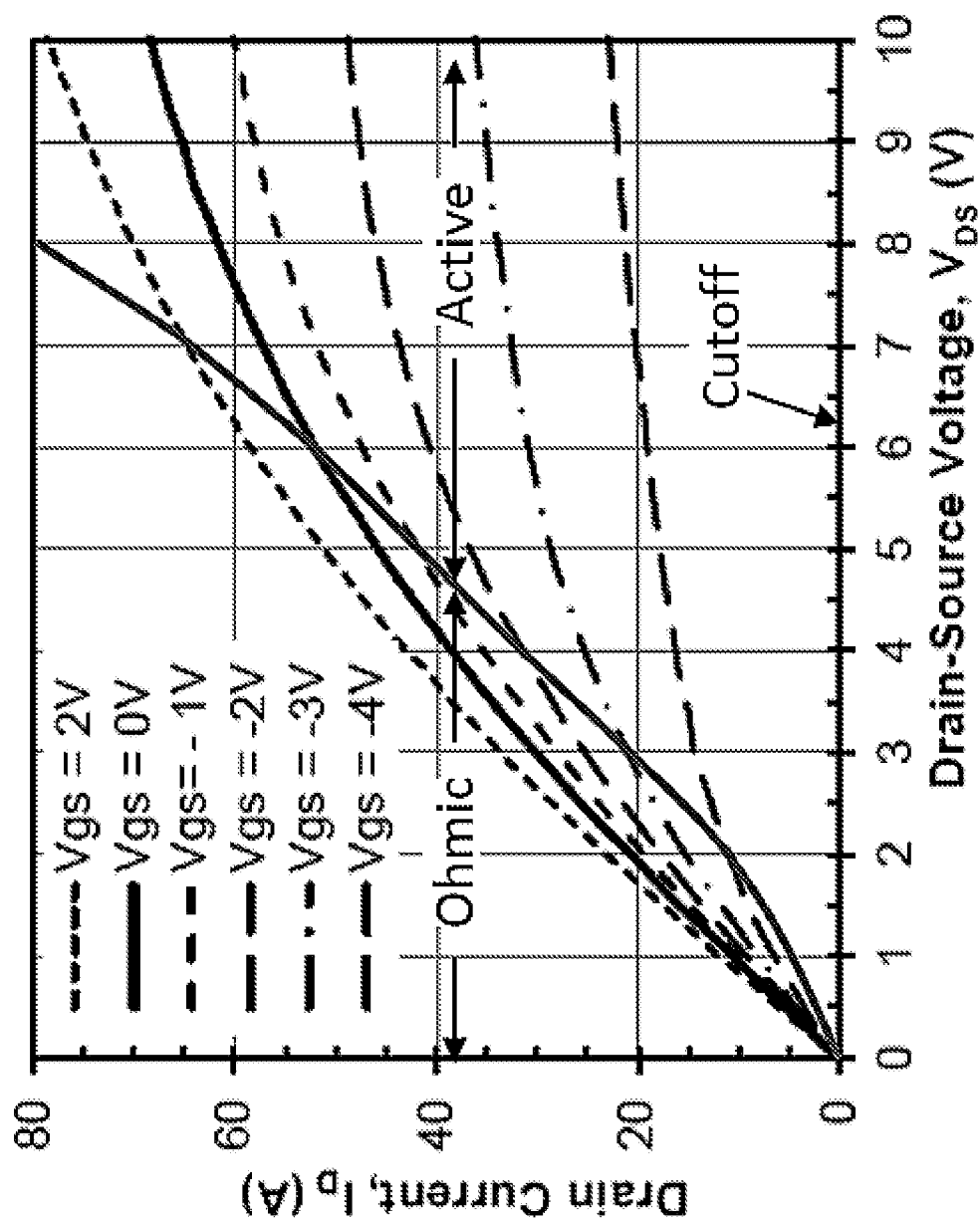
FIG. 3 is a graph of drain current versus drain-source voltage of an example FET with various gate-source voltages applied.

In practice, semiconductor switches exhibit a continuum of operating conditions between "on" and "off." FIG. 3 is a graph of output characteristics for an example 1200 V SiC JFET in three regions: a cutoff region, active linear region, and an ohmic region. In the cutoff region, the FET is considered to be "off" since only a very small current flows. When the gate-source voltage is driven sufficiently high, the FET enters the ohmic region, where the drain-source voltage $v_{DS}$ is small and current flow is largely determined by on-resistance.

Between the ohmic and cutoff regions is the "active linear region," herein designated as such to avoid confusion between different meanings for linear and saturation regions for power MOS, JFET, and bipolar transistors, for example. Operation within the active linear region is designated herein as "active linear mode", even though in much literature it is called "linear mode."

Operation within the active linear region accords with the following formula:

$$v_{DS} + V_{GS(th)} > v_{GS} > V_{GS(th)} \qquad \text{Equation 1}$$

If the gate-source voltage $v_{GS}$ exceeds the threshold voltage $V_{GS(th)}$ plus the applied drain-source voltage $v_{DS}$, then the FET enters the ohmic mode. If $v_{GS}$ falls below the threshold voltage, then by definition the FET is off; otherwise the FET is in active linear mode. This invention relates to forward biased operation, meaning operation with positive voltage and current for N-channel FETs as defined by $V_{in}$ and $I_{in}$ in FIG. 1.

Any number of FETs may be connected in series to achieve a required voltage and/or power handling capability for a power circuit. FIG. 1 illustrates an example power circuit with FETs Q1, Q2, . . . Qx. Only one of these FETs, called the current control FET, regulates the current through the series connection of FETs. In FIG. 1 the current control FET Q1 is the bottom FET. Current sense and control circuitry, represented by $R_{sense}$, C1, RFB, and operational amplifier U1 in FIG. 1, is referenced to the GND terminal, which in FIG. 1 is connected to the input negative terminal. FETs Q2 through Qx in FIG. 1 are called resistor-biased FETs. The current control FET and the resistor-biased FETs are collectively referred to as the load FETs because they can generate substantial heat in active linear mode. The gate voltage of each resistor-biased FET is determined by series-connected bias resistors RB1 through RBx. The gate resistors RG1 through RGx are optional, as are the dynamic voltage balance capacitors CB1 through CBx. ZG1 through ZGx are optional Zener diodes that protect the FET gates from overvoltage. The optional switch SW1 is operated either fully on or fully off (not in active linear mode), e.g., a cutoff switch, by the on/off signal with the dual purpose of quickly turning off and blocking current flow through all the FETs in case a fault condition requires it; and second of maintaining zero current through the load FETs, which would otherwise require extremely precise biasing of current control circuitry with the control signal set to zero. Switch SW1 dissipates negligible power because it is not operated in active linear mode; it is not a load FET. To insure proper operation under various operating conditions, the cutoff switch SW1 may be implemented as a normally-on or normally-off device, depending on which start is preferred while powering up the overall circuit.

In FIG. 1 the current control is implemented by operational amplifier U1 connected with negative feedback through RFB to the sense resistor $R_{sense}$. Capacitor C1 works in conjunction with RFB to provide noise filtering and improve stability of the current controller. Voltage generated across $R_{sense}$ is equal to the current through the FETs multiplied by the resistance of $R_{sense}$. Due to the large gain of U1, the voltage at the negative differential input terminal of U1 is forced to be essentially equal to the voltage at the positive differential input terminal of U1, which is the voltage of the control signal. A change in the current control signal is filtered and by RFB and C1, hence the corresponding change in Q1 gate-source voltage is slowed. A change in the gate-source voltage of Q1 results in a change in its drain-source voltage and current according to the output characteristic of Q1. This in turn causes the drain-source voltage and hence gate-source voltage of each of the load FETs to automatically adjust according its output characteristic. In this manner a single FET controls the common current through all series-connected FETs, regardless of differences in threshold voltages between FETs. The FETs can even be of different technology with significantly different threshold voltage and output characteristics. In this way, the current through the FETs is controlled by setting the control signal voltage equal to the desired FET current multiplied by the resistance of $R_{sense}$. The sum of the current through the FETs and the current through the bias resistors equals the input current $I_{in}$, which is the total load current.

This implementation of current control is only one example of many possible current control implementations, which are well known to those skilled in the art. For example, in place of a current sensing resistor, a Hall Effect sensor or other current sensing mechanism may be used. Similarly, other analog techniques may be employed in place of, or in conjunction with, a differential amplifier and a reference voltage. Further, digital feedback and mixed analog and digital circuits may be employed to control the current in current control transistor. For example, a different control signal, such as a current reference or digital signal may be used to set the current through current control transistors. Similarly, digital means may be used measure or adjust the operation of the current control transistors.

All but the current sense and control circuitry are copied and inverted, resulting in the AC-capable circuit of FIG. 2. The FETs labeled QP1 and QN1 are the current control FETs, and the FETs labeled QP2 through QPx and QN2 through QNx are the resistor-biased FETs. ZP1 through ZPx and ZN1 through ZNx are Zener diodes that protect the FET gates from overvoltage. An absolute value function is added to the current control so that the current control always has negative feedback. An absolute value function is familiar to those skilled in the art, and is conceptual only since other schemes could be used to ensure stable control of the current.

Not shown in FIG. 1 or FIG. 2 is line and load connections, for example in a SSCB application. Line and load are simply connected in series with the positive and negative terminals.

Practical Design Considerations

The gate voltage for the current control FET is set by the feedback current control circuitry based on maintaining the current through the series-connected FETs according to that commanded by the control signal. The gate-source voltage of each forward-biased load FET is near the FET threshold voltage in active linear mode, therefore the source voltage is offset from its gate voltage by approximately the threshold voltage. It follows then that the drain-source voltage of each load FET is equal to the gate voltages determined by the gate bias resistors, offset by approximately as much as a threshold voltage.

The gate bias resistors divide the load voltage $V_{in}$ according to their relative values. If the gate bias resistors are of equal value, which would be a typical implementation, then the input voltage is evenly divided and applied to the gates of the resistor-biased FETs. For example, with three series-connected FETs in FIG. 1 (x=3) Q1, Q2, and Q3, there are three gate bias resistors RB1, RB2, and RB3. With SW1 on, the gate voltage with respect to the negative terminal for Q2 and Q3 is approximately $$\frac{V_{in}}{3} \text{ and } \frac{2 \cdot V_{in}}{3}$$

respectively. The drain-source voltage of Q1, Q2, and Q3 is within a threshold voltage of $$\frac{V_{in}}{3}$$

plus the insignificantly small voltage drop across SW1 and $R_{sense}$. If $V_{in}$ is much greater in magnitude than each FET threshold voltage, which would be a typical situation, then each load FET dissipates essentially equal power, meaning the full power handling capability of each load FET can be utilized. It also is straightforward to keep each load FET within its FSOA since power dissipation is about equal in each load FET.

In a SSCB or other equipment it is desirable to substantially block current flow with a rapid transition from fully conducting to off. In FIG. 1 and FIG. 2 SW1 and SW2 can switch from on to off and cause current flow through the load FETs to be blocked within tens of nanoseconds. Regarding FIG. 1 it is easy to see how this happens. With SW1 off the voltage across Q1 can rise, which in turn reduces the gate-source voltage of the load FETs, including the current control FET Q1. The reduction in gate-source voltages causes further increase in drain-source voltages, which again further reduces gate-source voltages in a self-reinforcing manner until ultimately all FETs turn completely off. This process can happen very quickly, in the range of tens of nanoseconds. SW1 connected in series with the other FETs makes a cascode arrangement, where SW1 is not required to block high voltage. SW1 might avalanche due to leakage currents, but the energy involved is so low that there is no risk of it burning out. When SW1 turns off, Zener diode ZG1 protects the gate of FET Q1 from overvoltage. Zener diodes ZP1 through ZPx are optional. To be effective, such Zener diodes must have a breakdown voltage that is less than the gate voltage limit, but greater than, or equal, to the maximum output voltage from the current controller.

Extending the example to the AC-capable circuit of FIG. 2 and with x=3, the load FETs are QP1, QP2, QP3, QN1, QN2, and QN3. With equal value bias resistors the input voltage is evenly divided and applied to the gates of the resistor-biased FETs that are forward-biased, the same as in the circuit of FIG. 1. Beginning with positive $V_{in}$ with SW1 and SW2 on, the gate voltage of QP1 is set by the current control circuitry. A drain-source voltage develops across QP1 according to its output characteristic. The gate-source voltage of QP2 is determined by the drain voltage of QP1 and the bias resistors so that its drain-source current matches that of QP1. The gate-source voltage of each other FET through QPx is set the same way based on the drain voltage of the FET beneath it and the bias resistors, matching the drain-source current of QP1. Current through QN1 causes it to have a negative drain-source voltage, and the functions of the drain and source terminals are essentially swapped. This can be understood by rearranging Equation 1, showing that a FET is on when $v_{GS}-v_{DS}>V_{GS(th)}$. Since $v_{DS}$ is negative, QN1 turns on more with increasing magnitude of its $v_{DS}$ (caused for example by increased current through it), thus creating a positive reinforcement of QN1 turning on. QN1 turns on more than QP1 with its negative feedback, even with threshold voltage mismatch between QN1 and QP1, plus voltages across SW1, SW2, and a current sense resistor. Therefore the drain-source voltage of QN1 is small compared to that of QP1. QN2 through QNx also have negative drain-source voltages and are biased fully on. With negative yin applied, the functions of QP1 through QPx are swapped with those of QN1 through QNx; voltage and current polarities are reversed but otherwise the analysis is identical.

If a transistor type with an insulated gate, such as a MOSFET or an IGBT, is used for the resistor-biased FETs, then the gate protection Zener diode allows the gate bias voltages to be clamped to a low value for the reverse-biased FETs, essentially shorting out the gate bias resistors for load FETs with reverse current flow. If a JFET, MESFET, or another transistor type is used that allows gate (or base) current to flow with positive voltage applied, then the clamping function is intrinsic. When SW1 and SW2 turn off, the Zener diodes protect the gates of the load FETs. It is best practice to add a gate protection Zener diode anyway, but for the AC case they are required if SW1 and SW2 are included in the circuit. As with the DC circuit of FIG. 1, the Zener diodes must have a breakdown voltage less than the gate voltage limit but greater than or equal to the maximum output voltage from the current controller.

Each bias resistor can be implemented as multiple series-connected resistors. Heat generated in the bias resistors can be part of an electronic load function and thus made intentionally high to allow the use of fewer FETs, which can be higher cost than power resistors. Combining the function of biasing and power dissipation in the bias resistors can therefore make the electronic load more economical overall. This is only possible however for the DC case, as with the circuit of FIG. 1. With the AC case, as with the circuit of FIG. 2, the current through the bias resistors must be limited to prevent damage to the FET gates and/or gate-source Zener diodes mentioned in the previous paragraph. This imposes a minimum limit on the value of the bias resistors and thus limits their use for significant power dissipation.

It is possible to connect one end of the series string of bias resistors in the DC circuit of FIG. 1 to the negative terminal instead of to the top of SW1. Likewise, in the AC circuit of FIG. 2 the resistors RBP1 and RBN1 can be connected together instead of to SW1 and SW2, and these resistors could be combined to a single resistor. The same is true of the bias capacitors CBP1 and CBN1. A disadvantage however is that SW1 and SW2 cannot block bias current from flowing.

Current control can be implemented multiple ways that are understood by those skilled in the art, including the use of multiple operational amplifiers, digital control, and different types of current sensors such as resistors or Hall Effect sensors. The current sensor must be able to measure direct current. Gate-drain and drain-source capacitances improve dynamic voltage balancing. Dynamic voltage balance capacitors are optional and recommended for noise suppression. The voltage balancing must respond fast enough to accommodate sudden changes in operating conditions, such as a step change in $V_{in}$.

High FET gain makes current control difficult. Low FET gain is preferable for active linear mode operation, as opposed to switch-mode applications that generally require high FET gain. Because FETs used for active linear mode applications are usually designed with high gain for switch-mode applications, the current controller must have high precision. There are many high performance amplifiers available that can meet the precision requirement.

The generation of the control signal voltage is well known in the art. Examples relating to digital control include a digital-to-analog converter, or a pulse-width modulated signal filtered by a resistor-capacitor network.

On-voltage is an important parameter for electronic loads and other applications. High voltage silicon MOSFETs have very high on-resistance and therefore perform poorly in this regard. Wide band-gap devices such as SiC JFETs and SiC MOSFETs have much lower on-resistance at comparable voltage ratings; however they are generally higher cost than silicon-based FETs. Another advantage of this invention is the possibility to use lower voltage-rated FETs, which have inherently lower on resistance and lower cost.

Figure 4:
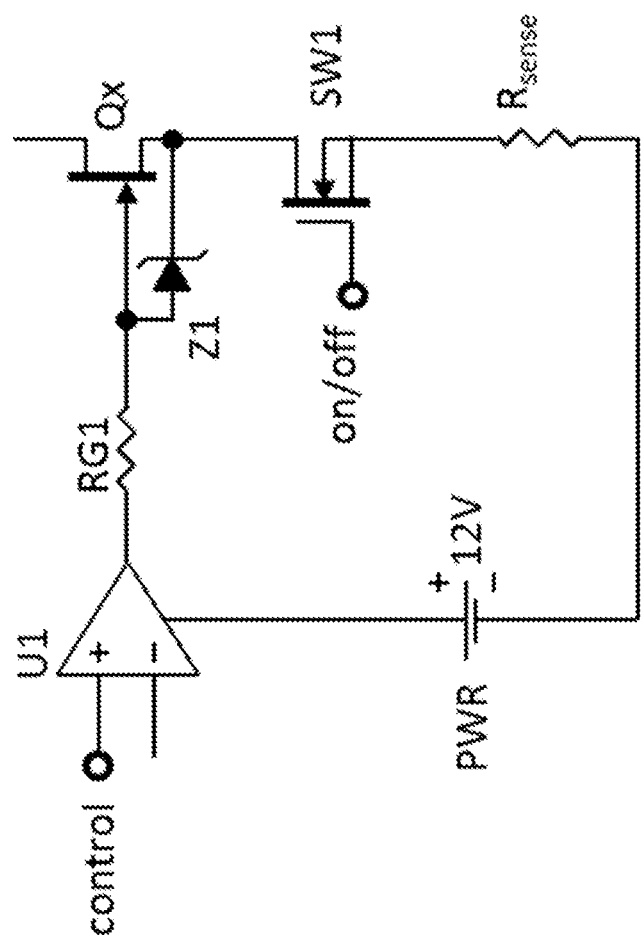
FIG. 4 is a sub-schematic of FIG. 1 showing an example voltage loop of a current control circuit.

SW1 and SW2 would typically be low-voltage MOS-FETs, which are readily available, low cost, and have very low on-resistance. The combined resistance of SW1, SW2, and of the current sense resistor $R_{sense}$ is low enough that the voltage across them at full load current is small enough to allow full control of the gate of the current control FETs by the current control circuitry. The voltage rating of SW1 sand SW2 should exceed any possible output voltage from the current controller (its power supply voltage) plus FET gate-source voltage. This is evident by Kirchhoff's voltage law around the example current controller of FIG. 1, reproduced partially in FIG. 4.

Assume for example that Z1 has a breakdown voltage of 15 V, and U1 is powered by ±12 V. The voltages around the current controller loop sum to zero, namely $V_{Rsense}+V_{SW1}+V_{Z1}+V_{RG1}-V_{PWR}=0$, where $VR_{sense}$ is the voltage across the current sense resistor $R_{sense}$, VSW1 is the drain-source voltage of SW1, VZ1 is the voltage across the protection Zener diode Z1 (also equal to the gate-source voltage of Q1), VRG1 is the voltage across RG1, and VPWR is the positive power supply to U1. The current through RG1 is so small that the voltage across it is considered to be zero. Solving for VSW1, the maximum value occurs when $VR_{sense}$ is zero. Q1 should therefore have a voltage rating exceeding 27 V to ensure that SW1 can be turned off under worst case conditions.

Simulation and Results

Figure 5:
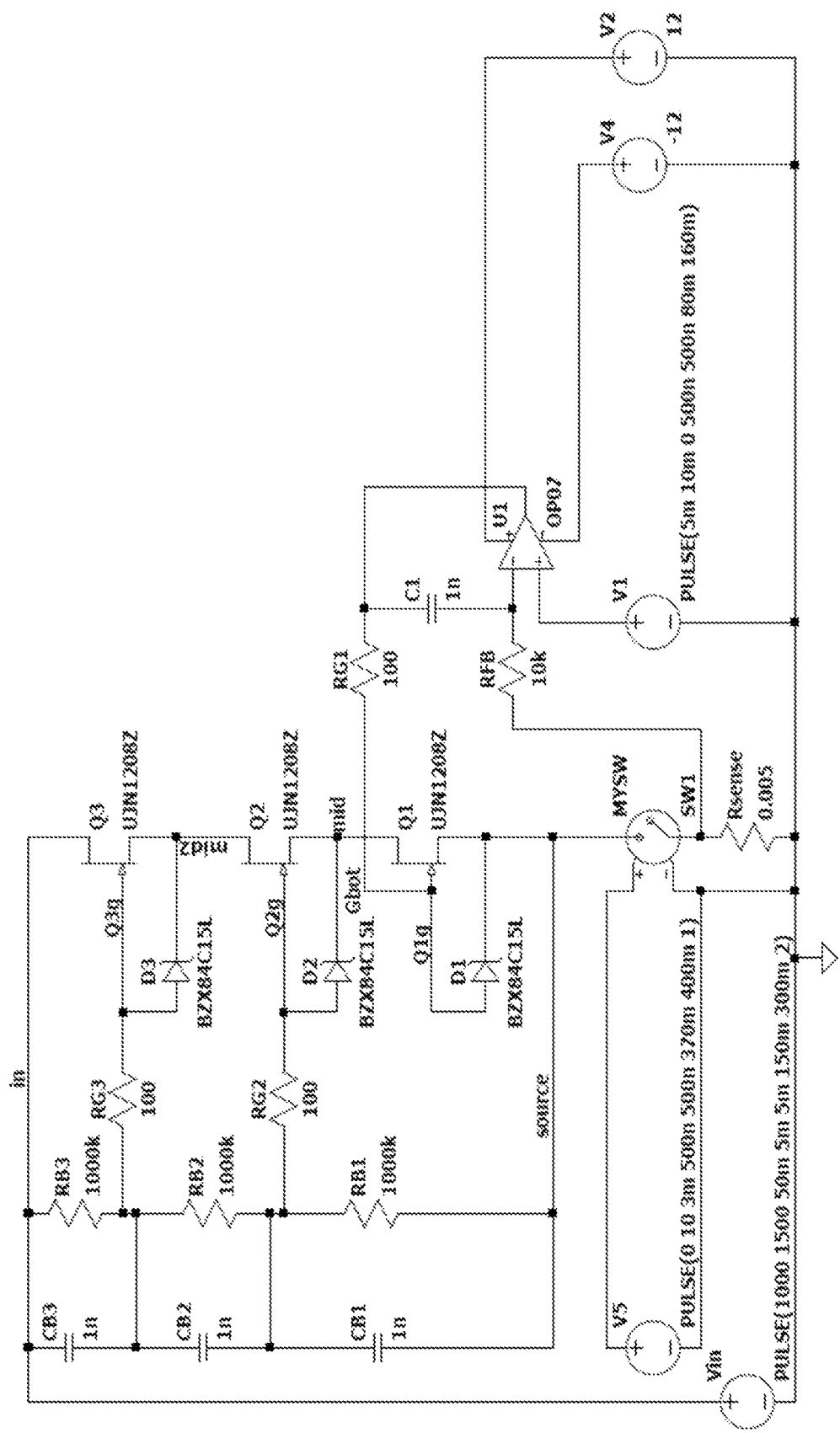
FIG. 5 is an example simulation schematic of the circuit in FIG. 1.

FIG. 5 shows a simulation schematic with three series-connected JFETs Q1, Q2, and Q3, similar to the DC circuit of FIG. 1. Voltage is sensed across the current sense resistor $R_{sense}$, and the voltage-controlled switch SW1 represents a MOSFET for on/off control. The control signal V1 pulses between 5 and 10 mV, which when divided by the sense resistance of 5 mΩ results in pulses of 1 and 2 A load current. Bias resistors RB1, RB2, and RB3 in parallel with dynamic voltage balance capacitors CB1, CB2, and CB3 divide the input voltage from Vim to the gates of JFETs Q2 and Q3. Zener diodes D1-D3 protect the JFETs Q1-Q3 from overvoltage. For simulation purposes, UJN1208Z JFETs and BZX84C15L diodes are assumed. The current control JFET Q1 is driven by operational amplifier U1. Switch SW1 is switched on and off, which would not typically be done in practice without first commanding the load current to zero. The input voltage $V_{in}$ also pulses between 1000 and 1500 V to simulate noise.

Figure 6A:
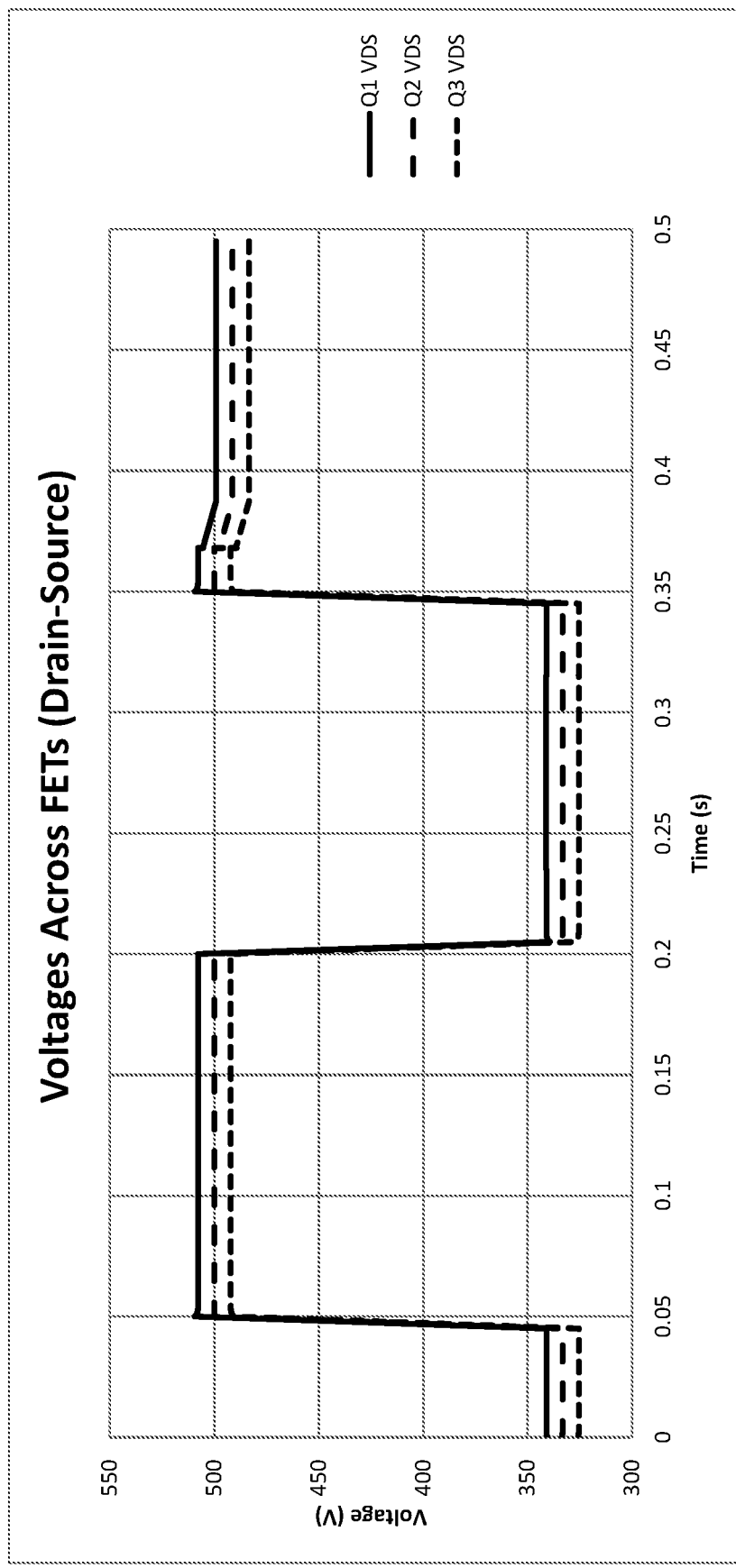
FIGS. 6A through 6D show simulation results for the circuit of FIG. 5.

FIGS. 6A-6D show results of simulations of the circuit of FIG. 5. FIG. 6A shows the drain-source voltage of each load FET, which remains very well balanced even with substantial changes in the input voltage. The drain-source voltages of the top and bottom load FETs have one threshold voltage less and more respectively than the middle FET. This is true regardless of how many FETs are connected in series; with equal value bias resistors the middle FETs have equal drain-source voltage.

Figure 6B:
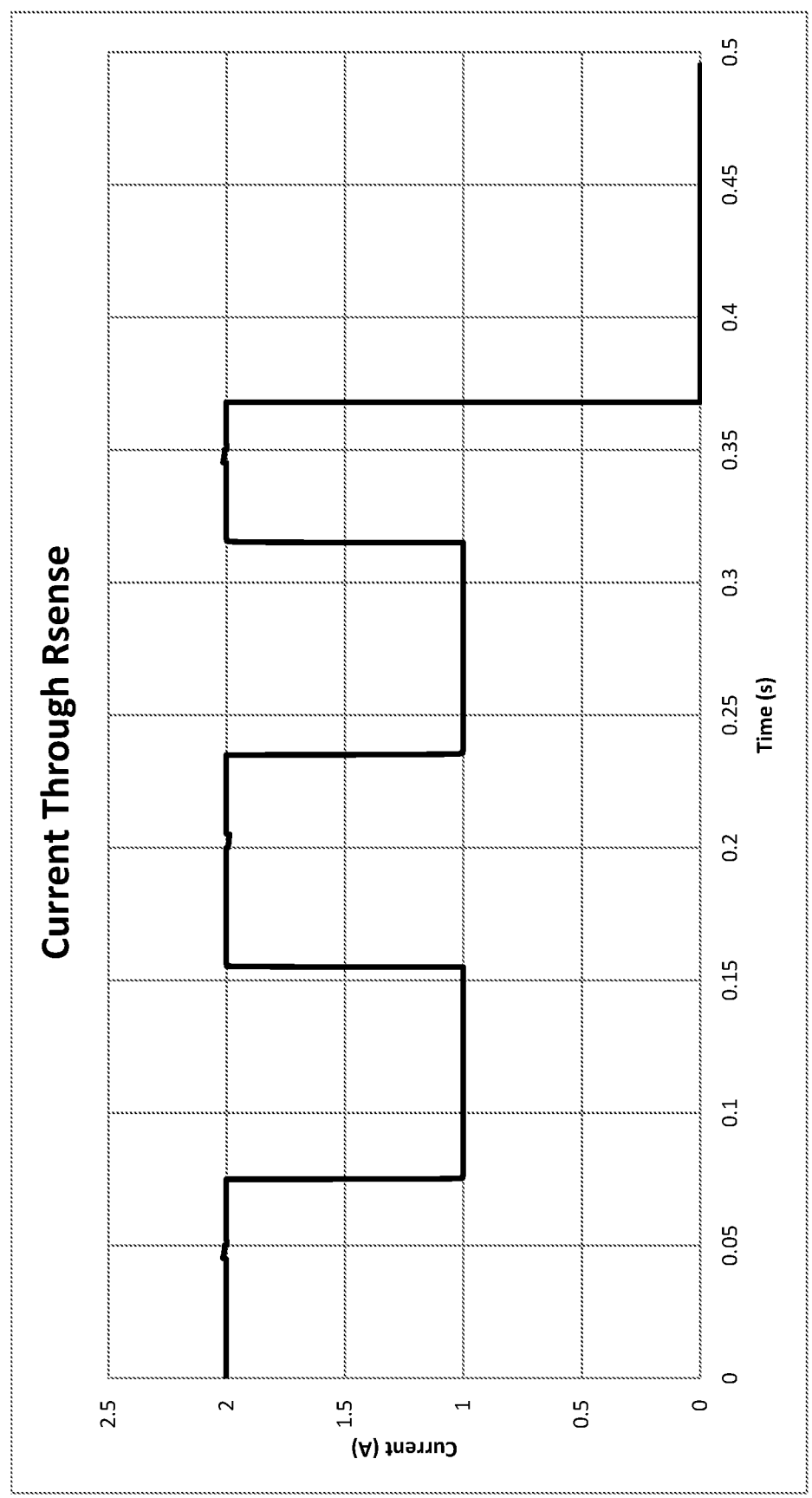

FIG. 6B shows the current through the current sense resistor $R_{sense}$. This is the total current including FET and bias resistor currents. The current makes clean transitions as commanded between 1 and 2 A, clearly demonstrating that a single FET can control the current through other series-connected FETs.

Figure 6C:
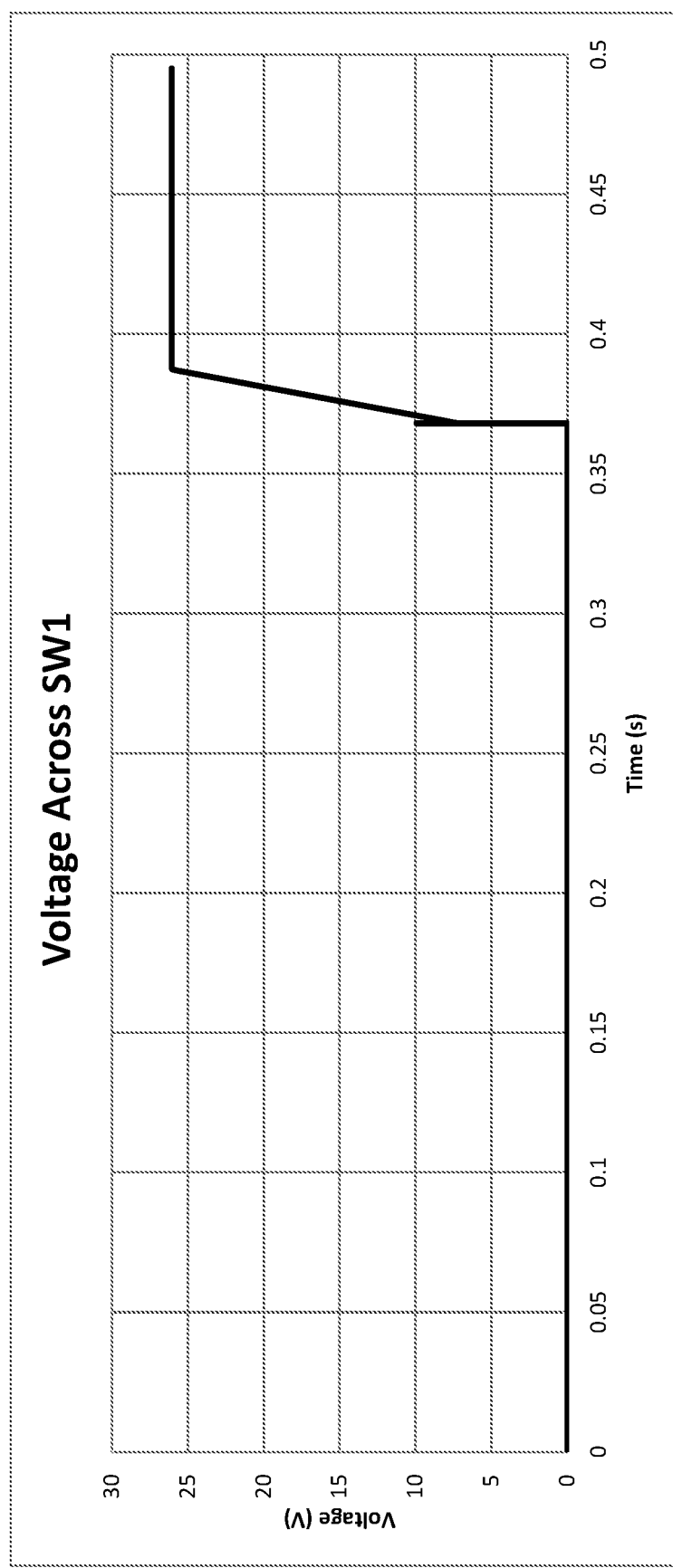

FIG. 6C shows the voltage across SW1, which remains less than 27 V (15 V across D1 plus 12 V at the output of U1). Therefore the voltage across SW1 is limited to a safe range even when SW1 turns on and off with load current. This also protects the current control circuitry, which in this case includes the operational amplifier U1.

Figure 6D:
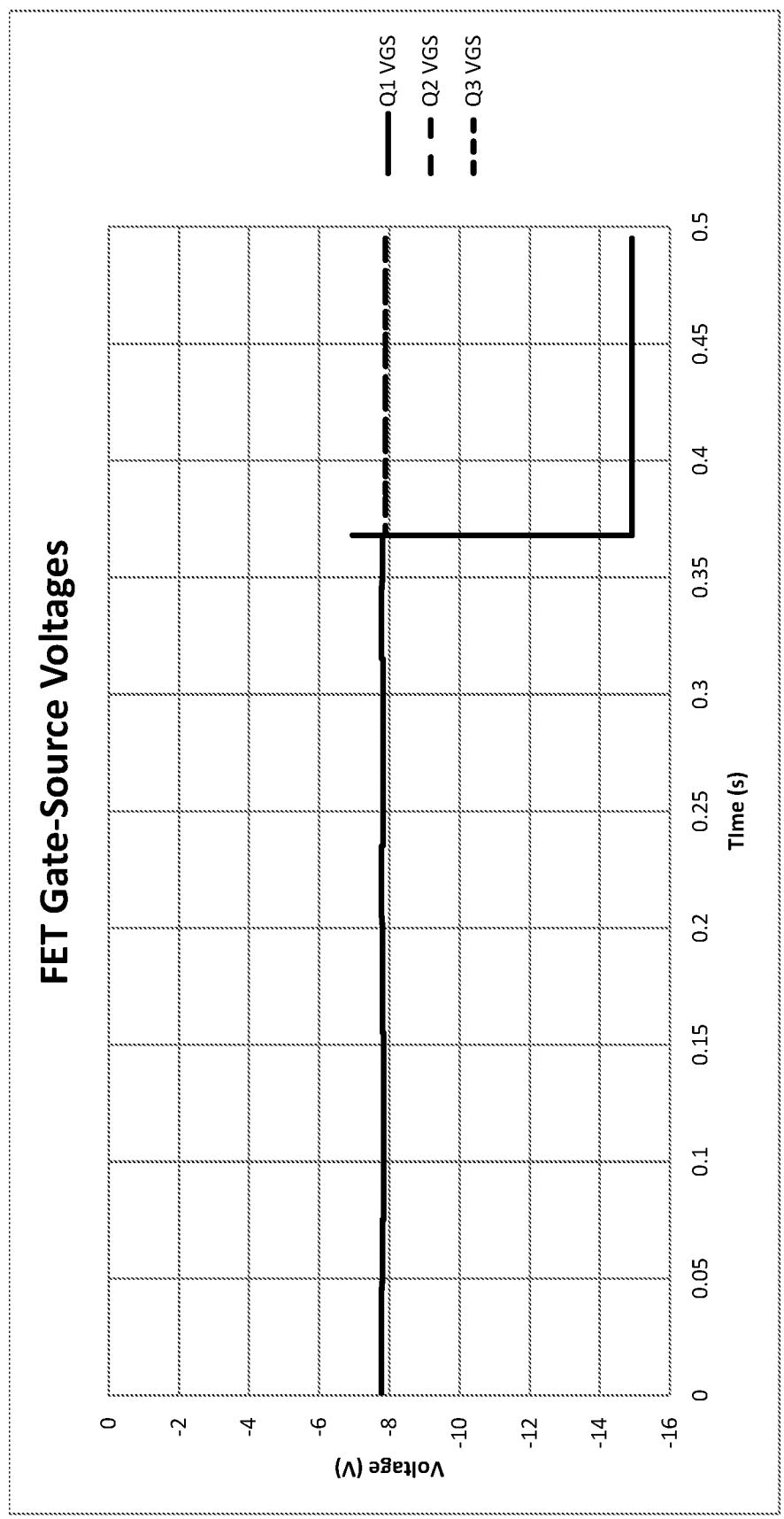

FIG. 6D shows the gate-source voltage of each load FET, which is a normally-on JFET with a threshold voltage near −7.5 V. When SW1 turns off at 0.37 s, the gate of Q1 is protected by D1, limiting the gate-source voltage to −15 V, and the current through the FETs quickly drops to zero.

Variations

A circuit comprising a first chain of switch devices connected in series between a positive terminal and a neutral terminal may be constructed as shown in FIG. 1. In practice, the switch devices may be any suitable power semiconductor switch, and the cutoff switch SW1 may be omitted.

For bipolar AC operation, a second chain of switch devices may be added, e.g., connected in series between the neutral terminal and a negative terminal, as illustrated in FIG. 2. In practice, a single cutoff switch may be added, e.g., to prevent conduction through the two chains of switches from the positive terminal to the negative terminal. Alternatively, if desired, two or more cutoff switches may be included, e.g., for separate control of conduction from the positive terminal to the neutral terminal and from the negative terminal to the neutral terminal.

For bipolar AC operation, a single current sense and control system may be used, e.g., as shown in FIG. 2. Alternatively, a separate current control circuit may be used for each of the first and second switch chains, for example.

Higher current carrying capacity of the circuit may be achieved by adding plural switch devices in parallel. For example, for each switch device in any of the chains of switch devices in FIGS. 1 and 2, there may be addition switch devices added in parallel. For example, one or more additional FETs may be connected to the source, drain, and gate connections of QP1 to QPx and of QN1 to QNx of FIG. 1.

I claim:

1. A circuit, comprising:
    a positive terminal and a neutral terminal;
    a first chain of switch devices, wherein:
        the switch devices are field effect transistors (FETs), each FET having a gate, a drain, and a source;
        the FETs are connected in series drain to source to form the first chain of switch devices; and
        the first chain of switch devices is connected between the positive terminal and the neutral terminal;
    the circuit further comprising:
        a first current control transistor, the first current control transistor being a FET having a gate, a drain, and a source, wherein the first current control transistor is connected in series with first chain of switch devices;
        a first biasing network, the first biasing network comprising a plurality of impedance devices, wherein the first biasing network is connected between the positive terminal and the neutral terminal, and wherein the first biasing network is further connected to the gate of each FET of the first chain of switch devices;
        a first current sensor, the first current sensor being connected in series between the first chain of switch devices and the neutral terminal; and
        a first current control circuit, the first current control circuit being connected to the first current sensor and the gate of the current control transistor,
        such that when a first voltage is applied across the positive terminal and neutral terminal, the first current control circuit adjusts a gate-to-source voltage of the first current control transistor to obtain a first current through the first current control transistor that is proportional to a first control signal, whereby, via the first biasing network, a gate-source voltage of each of the FETs in the first chain of switch devices is adjusted to maintain the first current and to distribute the first voltage across the FETs of first chain of switch devices and the first current control transistor.

2. The circuit of claim 1, wherein the FETs of the first chain of switch devices are junction field-effect transistors (JFETs).

3. The circuit of claim 2, wherein the FETs of the first chain of switch devices are silicon carbide (SiC) JFETs.

4. The circuit of claim 3, wherein a standoff voltage of the circuit from the positive terminal to the neutral terminal is greater than or equal to 500 V.

5. The circuit of claim 3, wherein a standoff voltage of the circuit from the positive terminal to the neutral terminal is greater than or equal to 1000 V.

6. The circuit of claim 3, wherein a standoff voltage of the circuit from the positive terminal to the neutral terminal is greater than or equal to 10,000 V.

7. The circuit of claim 2, wherein the FETs of the first chain of switch devices are silicon (Si) metal-oxide semiconductor field-effect transistors (MOSFETs).

8. The circuit of claim 3, further comprising, a cutoff switch, the cutoff switch being connected in series with the first chain of switch devices between the positive terminal and the neutral terminal.

9. The circuit of claim 8, wherein the cutoff switch is a metal-oxide semiconductor field-effect transistor (MOSFET).

10. The circuit of claim 1, further comprising:
    a negative terminal;
    a second chain of switch devices, wherein:
        the switch devices are field effect transistors (FETs), each FET having a gate, a drain, and a source;
        the FETs are connected in series drain to source to form the second chain of switch devices; and
        the second chain of switch devices is connected between the neutral terminal and the negative terminal;
    the circuit further comprising:
        a second current control transistor, the second current control transistor being a FET having a gate, a drain, and a source, wherein the second current control transistor is connected in series with the second chain of switch devices;
        a second biasing network, the second biasing network comprising a plurality of impedance devices, wherein the second biasing network is connected between the neutral terminal and the negative terminal, and wherein the second biasing network is further connected to the gate of each FET of the second chain of switch devices;
        a second current sensor, the second current sensor being connected in series between the first chain of switch devices and the second chain of switch devices; and
        a second current control circuit, the second current control circuit being connected to the second current sensor and to the gate of the second current control transistor,
        such that when a second voltage is applied across the negative terminal and positive terminal, the second current control circuit adjusts the gate-to-source voltage of the second current control transistor to obtain a second current through the second current control transistor that is proportional to a second control signal, whereby, via the second biasing network, a gate-source voltage of each of the FETs in the second chain of switches is adjusted to maintain the second current and to distribute the second voltage across the FETs of second chain of switch devices and the second current control transistor.

11. The circuit of claim 10, wherein:
    the second current sensor is the first current sensor;
    the second control signal is the first control signal; and the second current control circuit is the first current control circuit.

12. The circuit of claim 10, wherein the FETs of the second chain of switch devices are junction field-effect transistors (JFETs).

13. The circuit of claim 12, wherein the FETs of the second chain of switch devices are silicon carbide (SiC) JFETs.

14. The circuit of claim 13, wherein a standoff voltage of the circuit from the neutral terminal to the negative terminal is greater than or equal to 500 V.

15. The circuit of claim 13, wherein a standoff voltage of the circuit from the neutral terminal to the negative terminal is greater than or equal to 1000 V.

16. The circuit of claim 13, wherein a standoff voltage of the circuit from the neutral terminal to the negative terminal is greater than or equal to 10,000 V.

17. The circuit of claim 12, wherein the FETs of the second chain of switch devices are silicon (Si) metal-oxide semiconductor field-effect transistors (MOSFETs).

18. The circuit of claim 17, wherein a standoff voltage of the circuit from the neutral terminal to the negative terminal is greater than or equal to 1000 V.

19. The circuit of claim 13, further comprising, a cutoff switch, the cutoff switch being connected in series with the second chain of switch devices between the negative terminal and the neutral terminal.

20. The circuit of claim 19, wherein the cutoff switch is a metal oxide semiconductor field-effect transistor (MOSFET).

* * * * *